(12) United States Patent
Bhagat et al.

(10) Patent No.: US 9,312,927 B2
(45) Date of Patent: Apr. 12, 2016

(54) TUNABLE GUARD RING FOR IMPROVED CIRCUIT ISOLATION

(71) Applicant: QUALCOMM Incorporated, San Diego, CA (US)

(72) Inventors: Maulin Pareshbhai Bhagat, San Jose, CA (US); Thomas Andrew Myers, San Diego, CA (US); Lan Nan, San Diego, CA (US); Zhang Jin, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 97 days.

(21) Appl. No.: 14/076,298

(22) Filed: Nov. 11, 2013

(65) Prior Publication Data

US 2015/0130552 A1    May 14, 2015

(51) Int. Cl.
| | |
|---|---|
| *H04B 5/00* | (2006.01) |
| *H03H 7/01* | (2006.01) |
| *H01F 38/14* | (2006.01) |
| *H01L 23/522* | (2006.01) |
| *H01L 23/64* | (2006.01) |
| *H01L 49/02* | (2006.01) |

(Continued)

(52) U.S. Cl.
CPC ............. *H04B 5/0075* (2013.01); *H01F 38/14* (2013.01); *H01L 23/5223* (2013.01); *H01L 23/5227* (2013.01); *H01L 23/645* (2013.01); *H01L 23/66* (2013.01); *H01L 28/10* (2013.01); *H03H 7/0115* (2013.01); *H01L 27/101* (2013.01); *H01L 2223/6661* (2013.01); *H01L 2223/6688* (2013.01); *H01L 2924/0002* (2013.01)

(58) Field of Classification Search
CPC ..... H03H 7/09; H03H 7/0115; H03H 7/0123; H03H 7/0138; H01P 5/12; H01P 5/04; H01F 38/14; H04B 5/00; H04B 5/0075
USPC ................. 333/12, 177, 179, 180, 24 R, 175; 455/41.1
See application file for complete search history.

(56) References Cited

U.S. PATENT DOCUMENTS

| | | | |
|---|---|---|---|
| 5,097,236 A | * | 3/1992 | Wakino et al. ................. 333/175 |
| 5,497,146 A | | 3/1996 | Hebiguchi |
| 6,348,391 B1 | | 2/2002 | Fattaruso |

(Continued)

FOREIGN PATENT DOCUMENTS

WO    WO-2005074402 A2    8/2005

OTHER PUBLICATIONS

Ficq B.L., "Resonant Forward-Biased Guard Rings for Suppression of Substrate Noise in Mixed-Mode CMOS Circuits," 1995, 48 Pages.

(Continued)

*Primary Examiner* — Benny Lee
*Assistant Examiner* — Albens Dieujuste
(74) *Attorney, Agent, or Firm* — Smith Risley Tempel Santos LLC

(57) ABSTRACT

A tunable guard ring for improved circuit isolation is disclosed. In an exemplary embodiment, an apparatus includes a closed loop guard ring formed on an integrated circuit and magnetically coupled by a selected coupling factor to a first inductor formed on the integrated circuit. The apparatus also includes a tunable capacitor forming a portion of the closed loop guard ring and configured to reduce magnetic field coupling from the first inductor to a second inductor.

20 Claims, 4 Drawing Sheets

(51) Int. Cl.
*H01L 23/66* (2006.01)
*H01L 27/10* (2006.01)

(56) References Cited

U.S. PATENT DOCUMENTS 6,995,450 B2 2/2006 Yamamoto
8,428,545 B1* 4/2013 Kaunisto et al. ............. 455/334
2009/0167455 A1* 7/2009 Liu et al. ..................... 333/25
2011/0260819 A1 10/2011 Yeh et al.
2011/0273261 A1 11/2011 Signoff et al.
2012/0223796 A1 9/2012 Huang et al.

OTHER PUBLICATIONS

International Search Report and Written Opinion—PCT/US2014/064200—ISA/EPO—Feb. 16, 2015 (132676WO).

* cited by examiner

TUNABLE GUARD RING FOR IMPROVED CIRCUIT ISOLATION

BACKGROUND

1. Field

The present application relates generally to the operation and design of analog front ends, and more particularly, to the operation and design of guard rings to improve circuit isolation.

2. Background

Wireless devices are becoming increasing more complicated and now routinely provide multi-mode and multi-band operation. As a result, efficient utilization of circuit area has become a primary concern. To address this concern, smaller radio frequency integrated circuits (RFICs) are being developed. However, as RFICs become smaller in size with increasing functionality, maintaining isolation between the various circuits on the RFICs has become more and more challenging. For example, a single RFIC may include multiple circuits that operate in multiple frequency bands, respectively. Thus, an inductor of one circuit operating at a selected frequency may radiate an associated magnetic field that couples to inductors utilized in other circuits of the RFIC. This cross coupling of magnetic fields can result in degraded performance of one or more of the circuits on an RFIC. One technique used to overcome this cross coupling is to provide greater separation between the various circuits on the RFIC. Unfortunately, this may result in less efficient utilization of circuit area and larger RFICs that may not be suitable for small wireless devices.

Therefore, it would be desirable to have a mechanism for improved circuit isolation for use with RFICs to facilitate efficient utilization of circuit area.

BRIEF DESCRIPTION OF THE DRAWINGS

The foregoing aspects described herein will become more readily apparent by reference to the following description when taken in conjunction with the accompanying drawings wherein.

DETAILED DESCRIPTION

The detailed description set forth below in connection with the appended drawings is intended as a description of exemplary embodiments of the invention and is not intended to represent the only embodiments in which the invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
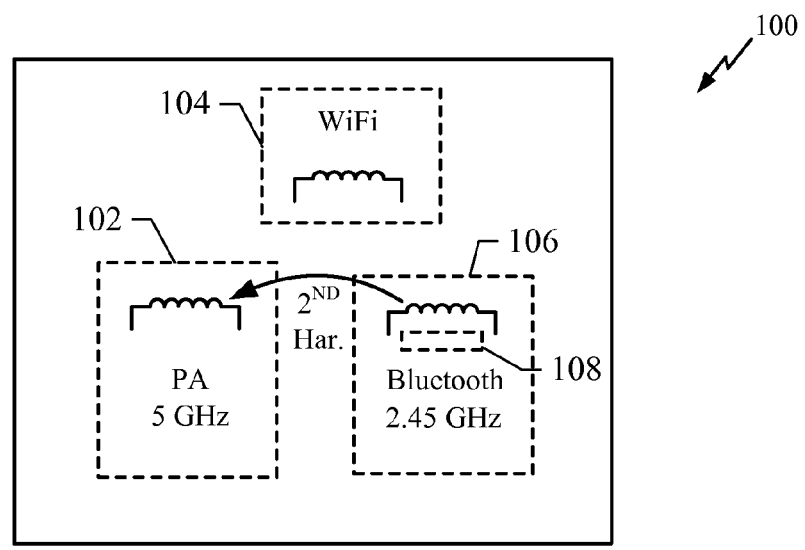
FIG. 1 shows an exemplary embodiment of an RFIC having multiple circuits and comprising a novel tunable closed guard ring for improved circuit isolation.

FIG. 1 shows an exemplary embodiment of an RFIC 100 having multiple circuits and comprising a novel tunable closed guard ring 108 for improved circuit isolation. The RFIC 100 comprises a first circuit 102 configured for operation in a 5 GHz frequency band, a second circuit 104 configured for operation in a 2.4 GHz WiFi frequency band, and a third circuit 106 configured for operation in a 2.45 GHz Bluetooth frequency band. The third circuit 106 comprises an exemplary embodiment of a tunable closed guard ring 108 configured to provide improved circuit isolation. In exemplary embodiments, the circuits 102, 104, 106 may comprise tank circuits, oscillator circuits, resonant circuits or any other type of circuit where signal coupling is a concern.

During operation, magnetic field energy may couple between the circuits 102, 104 and 106. For example, magnetic field energy associated with a $2^{ND}$ harmonic frequency from an inductor in the third circuit 106 may couple to an inductor in the first circuit 102. For example, magnetic field energy at the $2^{ND}$ harmonic frequency of the circuit 106 may be in the 5 GHz frequency band and couple to an inductor in the first circuit 102 thereby degrading performance of the first circuit 102, which is configured to operate at that frequency range.

The tunable closed guard ring 108 operates to reduce magnetic field energy at the $2^{ND}$ (or other) harmonic frequencies generated by the circuit 106 thereby reducing the amount of coupling to the first circuit 102 to provide increased circuit isolation. By utilizing the tunable closed guard ring 108 to provide increased circuit isolation, the area of the RFIC 100 can be efficiently utilized. For example, utilization of the tunable closed guard ring 108 allows the circuits 102 and 106 to be positioned closer in proximity to each other without degraded performance due to cross coupling of magnetic fields. A more detailed description of the tunable closed guard ring 108 is provided below.

Figure 2:
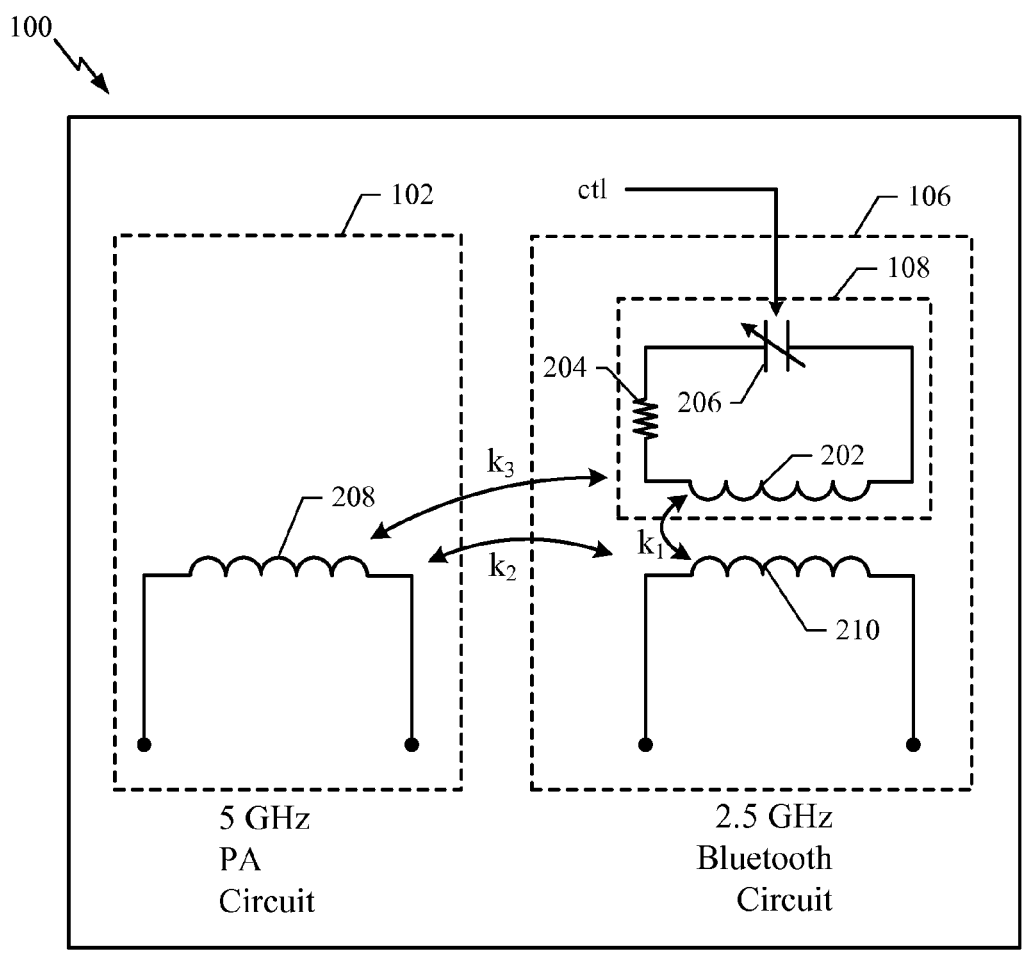
FIG. 2 shows an exemplary detailed embodiment of the tunable closed guard ring shown in FIG. 1.

FIG. 2 shows an exemplary detailed embodiment of the tunable closed guard ring 108. The circuit 106 comprises inductor 210, which can also be referred to as an aggressor inductor. The circuit 102 comprises inductor 208, which can also be referred to as a victim inductor. Due to the close proximity of the inductors 208, 210 on the circuit 100, it is possible for magnetic coupling from the aggressor inductor 210 to the victim inductor 208 to occur, thereby degrading performance of the circuit 102. For example, the inductor 210 may be coupled to the inductor 208 by a coupling factor $k_2$ and magnetic field energy associated with a $2^{nd}$ harmonic frequency of the circuit 106 may couple to the circuit 102 through the victim inductor 208.

The tunable closed guard ring 108 is configured to provide enhanced isolation to the victim inductor 208 by frequency selective coupling to reduce coupling of the magnetic field energy radiated by the aggressor inductor 210 at the selected frequency. The tunable closed guard ring 108 comprises a closed loop with inductor 202 connected in series with a variable (or tunable) capacitor 206 and resistor 204. In exemplary embodiments, the tunable closed guard ring 108 is formed by appropriately routed signal traces on the RFIC 100. The signal traces are configured to provide a selected amount of inductance for the inductor 202 and a selected amount of resistance for the resistor 204. The capacitor 206 comprises any suitable tunable capacitor device that forms part of the tunable closed guard ring 108.

In an exemplary embodiment, the tunable closed guard ring 108 is placed within a region close to the aggressor inductor 210 so that a selected amount of coupling ($k_1$) between the aggressor inductor 210 and the inductor 202 of the tunable guard ring 108 is established. It is also possible that a selected amount of coupling ($k_3$) exists between the inductor 202 of the tunable closed guard ring 108 and the victim inductor 208.

The series connected tunable capacitor 206 provides a selected amount of capacitance that is controlled using a control signal (ctl), which in various embodiments is generated by a controller, processor or some other entity configured for operation with the RFIC 100. The amount of capacitance provided by the tunable capacitor 206 is selected such that the tunable closed guard ring 108 acts approximately as an open circuit at the aggressor inductor's 210 operating frequency. Outside the aggressor inductor's 210 operating frequency the tunable guard ring 108 acts approximately as a short circuit. Thus, in the embodiment shown in FIG. 2, the tunable closed guard ring 108 acts approximately as an open circuit at 2.5 GHz and approximately as a closed circuit for second harmonic frequencies at 5 GHz. Thus, the tunable closed guard ring 108 operates to reduce magnetic field energy at the $2^{nd}$ harmonic frequencies at 5 GHz. As a result, the victim inductor 208 is protected (or isolated) from magnetic field energy at $2^{ND}$ harmonic frequencies generated by the aggressor inductor 210 that may couple to the victim inductor 208 and degrade performance of the circuit 102.

The tunable closed guard ring 108 also operates to provide high impedance (i.e., an approximately open circuit) at the frequency of operation of the aggressor inductor 210 and therefore does not degrade the performance of the aggressor inductor 210 or the circuit 106.

Accordingly, exemplary embodiments of a tunable closed guard ring 108 are disclosed that overcome the problems associated with conventional guard rings. The tunable closed guard ring 108 comprises a tunable ring that is placed within or around an inductor to reduce magnetic field energy radiated from the inductor at selected frequencies. The tunable closed guard ring 108 comprises inductance, resistance and a tunable capacitance that can be tuned to a selected frequency. In an exemplary embodiment, the signal trace routing of the tunable closed guard ring 108 can provide the series inductance and resistance. The tunable capacitor is selected such that the RLC ring is effectively open for the inductor's operating frequency and is effectively shorted for higher frequencies. As a result, circuit isolation on an RFIC can be improved to facilitate efficient utilization of circuit area.

Therefore, a tunable guard ring for improved circuit isolation is disclosed. In an exemplary embodiment, an apparatus includes a closed loop guard ring formed on an integrated circuit and magnetically coupled by a selected coupling factor to a first inductor formed on the integrated circuit. The apparatus also includes a tunable capacitor forming a portion of the closed loop guard ring and configured to reduce magnetic field coupling from the first inductor to a second inductor.

Figure 3:
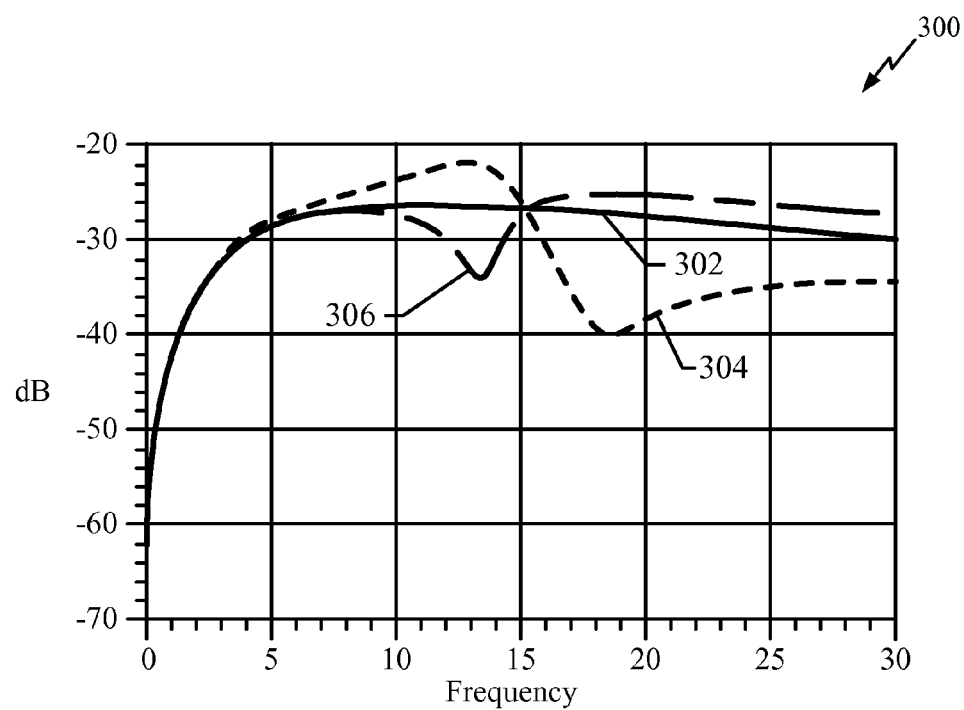
FIG. 3 shows a graph that illustrates a reduction in signal coupling provided by an exemplary embodiment of a tunable closed guard ring.

FIG. 3 shows a graph 300 that illustrates a reduction in signal coupling provide by an exemplary embodiment of a tunable closed guard ring. For example, the graph 300 illustrates how the tunable closed guard ring 108 reduces signal coupling between the circuits 106 and 102 on the RFIC 100.

It will be assumed that the values of inductor 202 and resistor 204 are determined from selected signal trace routing and that the value of the tunable capacitor 206 is set to a selected capacitance value by a processor or other entity coupled to the circuit 100.

The graph 300 comprises plot line 302 which represents signal coupling between the circuits 106 and 102 with no guard ring. For example, in this case there is coupling (k2) between the circuits 106 and 102 but no coupling between the circuits 106 and 102 and the tunable closed guard ring 108 (i.e., k1=k3=0). The graph 300 also comprises plot line 304, which results from signal coupling between the circuits 106 and 102 and the tunable close guard ring 108 (i.e., k1 and k3 are non zero). Typically, k1 is greater than k3.

The graph 300 also comprises plot line 306 which results from selected signal coupling between the circuit 106 and the tunable closed guard ring 108 (i.e., k1 not zero and k3 approaching zero). As can be seen from the plot line 306, there is a reduction in coupling represented by a notch over a narrow frequency range, whereas the plot line 304 shows a reduction over a broader frequency range at the expense of an increase in coupling at lower frequencies.

Accordingly, as illustrated by the graph 300, the values of the inductor 202, resistor 204, and capacitor 206 of the tunable closed guard ring 108 can be selected so as to generate a notch (i.e., plot 306) in the coupling between the aggressor component (inductor 210) and the victim component (inductor 208). In an exemplary embodiment, the notch can be located at the $2^{nd}$ harmonic (5 GHz) of the operating frequency (2.5 GHz) of the circuit 106, and therefore reduce magnetic coupling to the inductor 208 of the circuit 102. Thus, the tunable closed guard ring 108 operates to increase circuit isolation to allow more efficient circuit area utilization.

Figure 4:
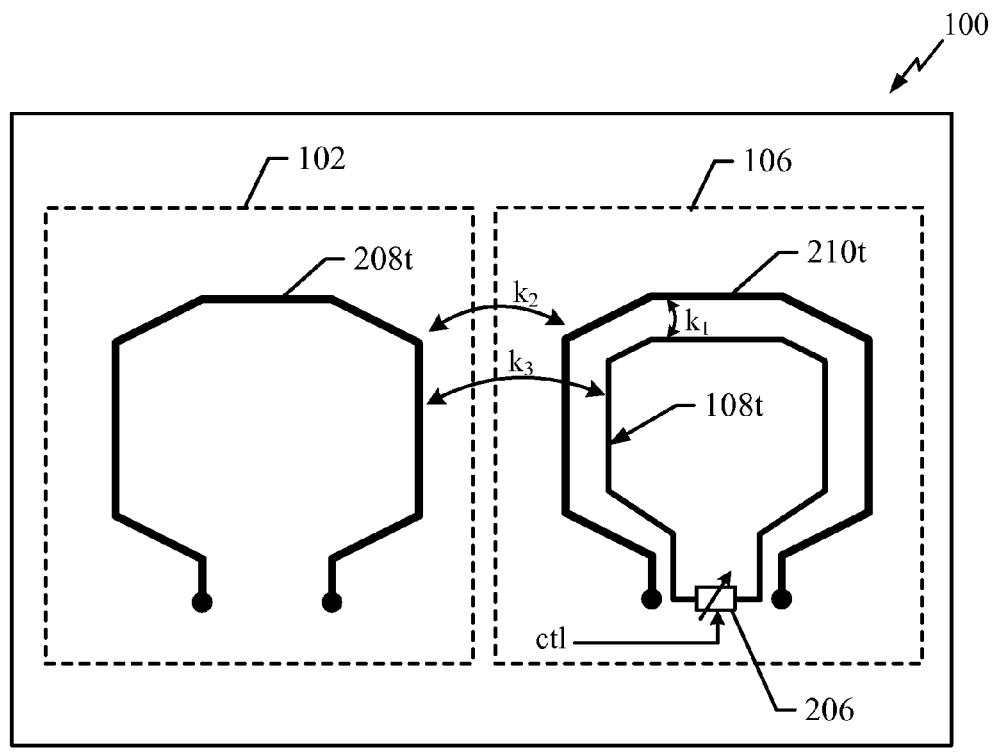
FIG. 4 illustrates an exemplary implementation of a tunable closed guard ring.

FIG. 4 illustrates an exemplary implementation of the tunable closed guard ring 108 on the integrated circuit 100. In this implementation, the tunable closed guard ring 108 comprises a signal trace 108t routed within a region defined by a signal trace 210t representing the aggressor inductor 210. The tunable closed guard ring 108 operates to provide improved isolation to a signal trace 208t representing the victim inductor 208 from magnetic field energy emitted by the aggressor inductor 210 at second harmonic frequencies (i.e., 5 GHz). For example, the signal trace 108t representing the tunable closed guard ring 108 is positioned so as to couple to the signal trace 210t representing the aggressor inductor 210 by the coupling factor $k_1$. The tunable closed guard ring 108 provides several different degrees of freedom to optimize the isolation between two circuit blocks 102 and 106. For example, the isolation can be adjusted by adjusting one or more of the following.

1. Adjusting the spacing between the tunable guard ring trace 108t and aggressor inductor trace 210t.
2. Adjusting the spacing between the tunable guard ring trace 108t and victim inductor trace 208t.
3. Adjusting the location of the tunable guard ring trace 108t (i.e., inside or outside the aggressor inductor trace 210t).
4. Adjusting the cross-sectional size of the tunable guard ring trace 108t.
5. Adjusting the length of the tunable guard ring trace 108t.
6. Adjusting the capacitance value of the tunable capacitor 206.
7. Adjusting the inductance and/or resistance values of the tunable guard ring trace 108t.

Therefore, in various exemplary embodiments, the closed tunable guard ring can comprise a selectable range of R, L, C, combinations and/or any equivalent active/switching devices that can be tuned as described above to reduce magnetic coupling and improve isolation between aggressor and victim circuit blocks or devices.

Figure 5:
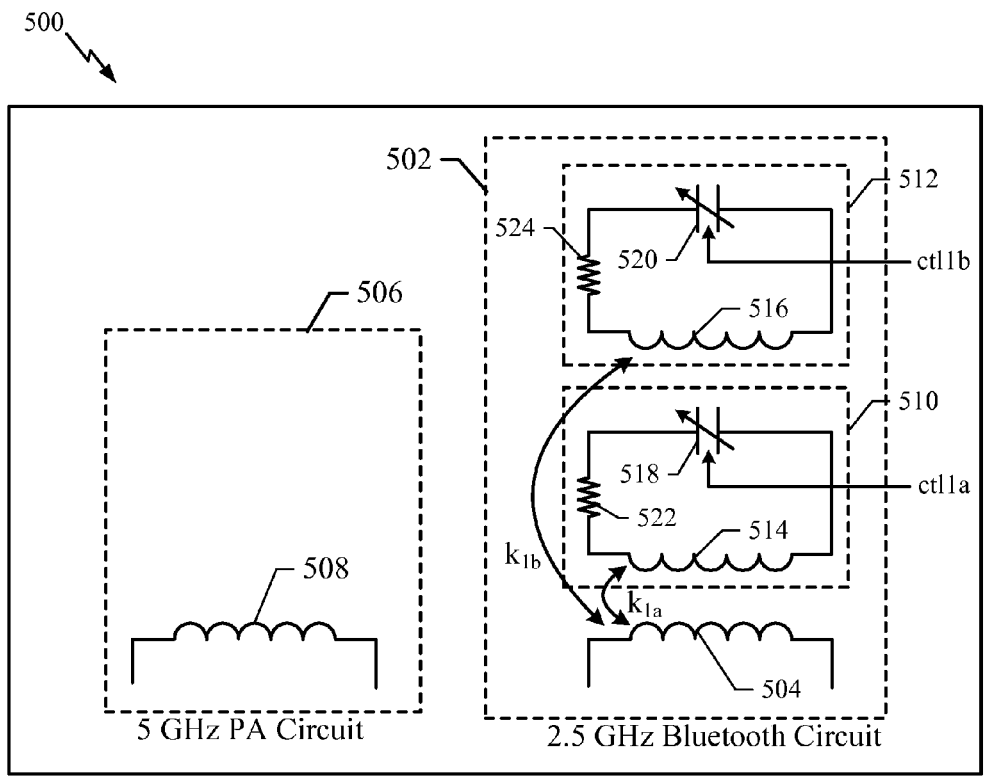
FIG. 5 shows an exemplary detailed embodiment of an RFIC comprising a multiple closed guard ring implementation.

FIG. 5 shows an exemplary detailed embodiment of an RFIC 500 comprising a multiple tunable closed guard ring implementation. In this implementation, the RFIC 500 comprises a Bluetooth circuit 502 having inductor 504, which can also be referred to as an aggressor inductor. The RFIC 500 also comprises a PA circuit 506 operating at 5 GHz and comprising inductor 508, which can also be referred to as a victim inductor. Due to the close proximity of the inductors 504 and 508 on the circuit 500, it is possible for magnetic field coupling from the aggressor inductor 504 to the victim inductor 508 to occur, thereby degrading performance of the PA circuit 506. For example, magnetic coupling at $2^{nd}$ harmonic frequencies (i.e., 5 GHz) of the 2.5 GHz Bluetooth circuit 502 to the 5 GHz PA circuit 506 may occur.

In an exemplary embodiment, multiple tunable closed guard rings 510 and 512 are configured to provide enhanced isolation to the victim inductor 508 by frequency selective coupling. The multiple tunable closed guard rings 510 and 512 comprise closed loops that include inductors 514, and 516 connected in series with tunable capacitors 518 and 520, respectively. In exemplary embodiments, the multiple tunable closed guard rings 510 and 512 also comprise resistances 522 and 524 as shown.

In an exemplary embodiment, the tunable closed guard ring 510 is placed within a region bound by the aggressor inductor 504 so that a selective amount of coupling (k1 a) between the aggressor inductor 504 and the tunable closed guard ring 510 is established. In an exemplary embodiment, the tunable guard ring 512 is placed around the aggressor inductor 504 so that a selective amount of coupling (k1 b) between the aggressor inductor 504 and the tunable closed guard ring 512 is established.

The series connected tunable capacitor 518 provides a selected amount of capacitance that is controlled using a first control signal (ctl1a), which in various embodiments is generated by a controller, processor, or some other entity configured for operation with the integrated circuit 500. The amount of capacitance provided by the tunable capacitor 518 is selected such that the tunable closed guard ring 510 acts as substantially as an open circuit at 2.5 GHz and substantially as a closed circuit for second harmonic frequencies at 5 GHz.

The tunable closed guard ring 512 operates similarly to the ring 510 and can be tuned to a different operating frequency using the tunable capacitor 520. As a result, the victim inductor 508 can be protected (or isolated) from magnetic field energy at $2^{ND}$ (or other) harmonic frequencies or other frequencies generated by the aggressor inductor 504 that would otherwise couple to the victim inductor 508 and degrade performance of the power amplifier circuit 506.

Accordingly, exemplary embodiments of a tunable guard ring are disclosed that overcome the problems associated with conventional guard rings. The tunable guard ring comprises a tunable ring that is placed within, around, or both within and around an aggressor inductor to reduce magnetic field energy at selected frequencies emitted from an aggressor inductor.

Figure 6:
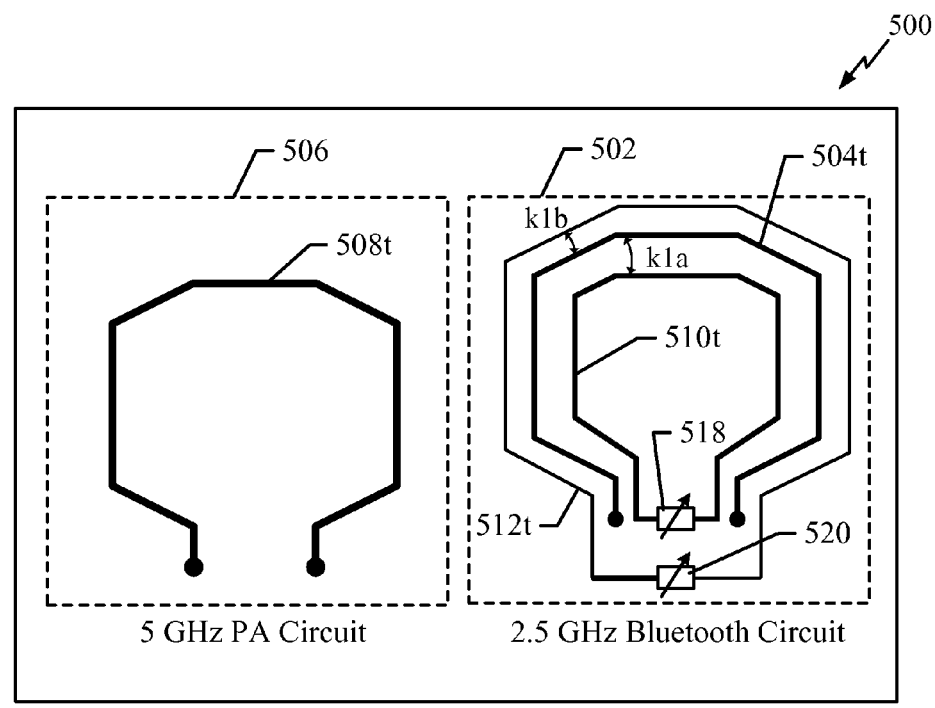
FIG. 6 illustrates an exemplary implementation of the RFIC shown in FIG. 5.

FIG. 6 illustrates an exemplary implementation of the RFIC 500 shown in FIG. 5. In this implementation, a signal trace 510t representing the tunable guard ring 510 is placed within a region bound by a signal trace 504t representing the aggressor inductor 504 of the 2.5 GHZ Bluetooth circuit 502 to provide improved isolation to the signal trace 508t representing the victim inductor 508 from magnetic field energy at $2^{nd}$ harmonic frequencies (i.e., 5 GHz) emitted by the aggressor inductor 504. Furthermore, a signal trace 512t representing the tunable closed guard ring 512 is placed around the signal trace 504t representing aggressor inductor 504 in the 2.5 GHZ Bluetooth circuit 502 to provide improved isolation to the victim inductor 508t from magnetic field energy at second harmonic frequencies (i.e., 5 GHz) emitted by the aggressor inductor 504.

Therefore, in various exemplary embodiments, a multiple tunable closed guard ring configuration can comprise two or more guard rings that are positioned within or around an aggressor inductor. The multiple guard rings are tuned to reduce magnetic field energy radiated from an aggressor inductor at one or more frequencies ranges or bands.

Figure 7:
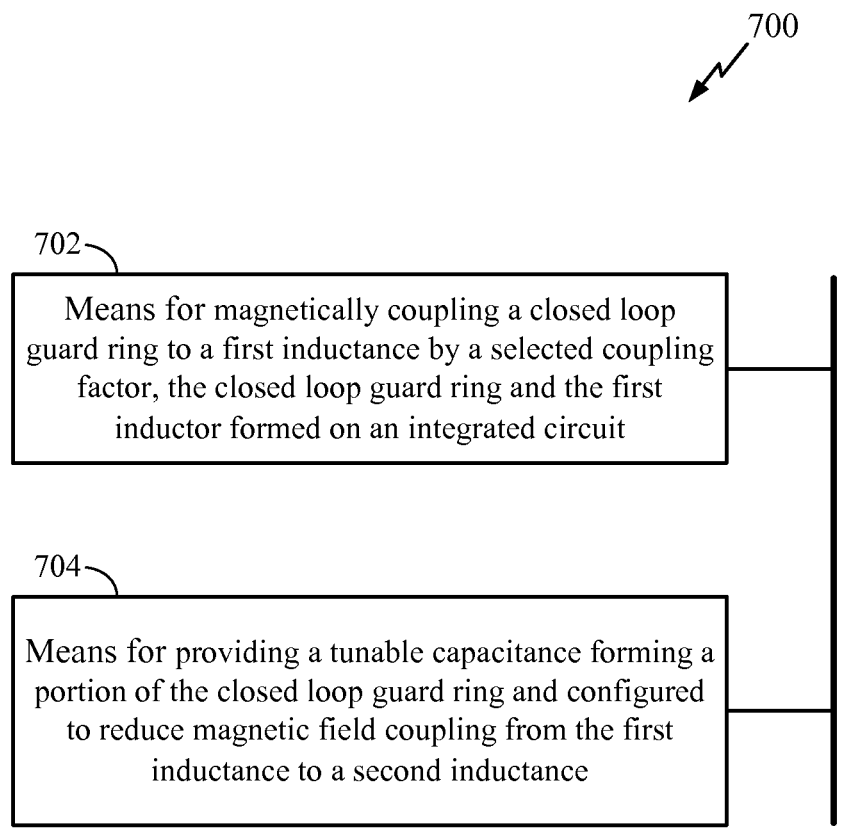
FIG. 7 shows an exemplary embodiment of a tunable closed guard ring apparatus configured for improved circuit isolation.

FIG. 7 shows an exemplary embodiment of a tunable closed guard ring apparatus 700 configured for improved circuit isolation. For example, the apparatus 700 is suitable for use as the tunable closed guard ring 108 shown in FIG. 2. In an aspect, the apparatus 700 is implemented by one or more modules configured to provide the functions as described herein. For example, in an aspect, each module comprises hardware and/or hardware executing software.

The apparatus 700 comprises a first module comprising means (702) for magnetically coupling a closed loop guard ring to a first inductance by a selected coupling factor, the closed loop guard ring and the first inductor formed on an integrated circuit, which in an aspect comprises the closed loop guard ring 108.

The apparatus 700 comprises a second module comprising means (704) for providing a tunable capacitance forming a portion of the closed loop guard ring and configured to reduce magnetic field coupling from the first inductance to a second inductance, which in an aspect comprises the tunable capacitor 206.

Those of skill in the art would understand that information and signals may be represented or processed using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. It is further noted that transistor types and technologies may be substituted, rearranged or otherwise modified to achieve the same results. For example, circuits shown utilizing PMOS transistors may be modified to use NMOS transistors and vice versa. Thus, the amplifiers disclosed herein may be realized using a variety of transistor types and technologies and are not limited to those transistor types and technologies illustrated in the Drawings. For example, transistors types such as BJT, GaAs, MOSFET or any other transistor technology may be used.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both non-transitory computer storage media and communication media including any medium that facilitates transfer of a computer program from one place to another. A non-transitory storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the invention is not intended to be limited to the exemplary embodiments shown herein but is to be accorded the widest scope consistent with the principles and novel features disclosed herein.

What is claimed is:

1. An apparatus comprising:
a closed loop guard ring formed on an integrated circuit and magnetically coupled by a selected coupling factor to a first inductor formed on the integrated circuit; and
a tunable capacitor forming a portion of the closed loop guard ring and configured to reduce magnetic field coupling from the first inductor to a second inductor.

2. The apparatus of claim 1, wherein the closed loop guard ring surrounds the first inductor on the integrated circuit.

3. The apparatus of claim 1, wherein the tunable capacitor is tuned in response to a control signal.

4. The apparatus of claim 1, wherein the first inductor surrounds the closed loop guard ring on the integrated circuit.

5. The apparatus of claim 4, further comprising one or more additional closed loop guard rings coupled to the first inductor on the integrated circuit.

6. The apparatus of claim 5, further comprising at least one additional closed loop guard ring surrounding the first inductor on the integrated circuit.

7. The apparatus of claim 1, wherein the first inductor forms a part of a first circuit that operates at a first frequency and the second inductor forms a part of a second circuit that operates at a second frequency.

8. The apparatus of claim 7, wherein the first frequency is configured to be lower than the second frequency.

9. The apparatus of claim 8, wherein the closed loop guard ring is further configured to reduce magnetic field coupling of a harmonic of the first frequency to the second inductor.

10. The apparatus of claim 1, wherein the closed loop guard ring comprises inductive elements which include the closed loop guard ring, resistive elements, and capacitive elements which include the tunable capacitor, said inductive, resistive and capacitive elements are connected in series and the series connected elements are tuned to reduce magnetic field coupling from the first inductor to the second inductor within a selected frequency range.

11. An apparatus comprising:
means for magnetically coupling a closed loop guard ring to a first inductance by a selected coupling factor, the closed loop guard ring and the first inductance formed on an integrated circuit; and
means for providing a tunable capacitance forming a portion of the closed loop guard ring and configured to reduce magnetic field coupling from the first inductance to a second inductance.

12. The apparatus of claim 11, wherein the closed loop guard ring surrounds the first inductance on the integrated circuit.

13. The apparatus of claim 11, wherein the means for providing a tunable capacitance is being configured to be tuned in response to a control signal.

14. The apparatus of claim 11, wherein the first inductance is configured to surround the closed loop guard ring on the integrated circuit.

15. The apparatus of claim 14, further comprising one or more additional closed loop guard rings coupled to the first inductance on the integrated circuit.

16. The apparatus of claim 15, further comprising at least one additional closed loop guard ring surrounding the first inductance on the integrated circuit.

17. The apparatus of claim 11, wherein a part of a first circuit, which is formed by the first inductance, operates at a first frequency and a part of a second circuit, which is formed by the second inductance, operates at a second frequency.

18. The apparatus of claim 17, wherein the first frequency is configured to be lower than the second frequency.

19. The apparatus of claim 18, wherein the closed loop guard ring is further configured to reduce magnetic field coupling of a harmonic of the first frequency to the second inductance.

20. The apparatus of claim 11, wherein the closed loop guard ring comprises inductive elements which include the closed loop guard ring, resistive elements, and capacitive elements which include the tunable capacitor, said inductive, resistive and capacitive elements are connected in series and the series connected elements are tuned to reduce magnetic field coupling within a selected frequency range.

* * * * *